United States Patent [19]

Dynie

[11] Patent Number: 4,947,289
[45] Date of Patent: Aug. 7, 1990

[54] LATCH MECHANISM FOR A PLUG-IN CARTRIDGE OR THE LIKE

[75] Inventor: Ernest R. Dynie, Nepean, Canada

[73] Assignee: Northern Telecom Limited, Montreal, Canada

[21] Appl. No.: 424,033

[22] Filed: Oct. 19, 1989

[51] Int. Cl.$^5$ .............................................. H05K 7/02
[52] U.S. Cl. ................................... 361/415; 361/391; 361/399; 403/16; 403/321; 439/152; 439/160; 439/328
[58] Field of Search .................. 211/41; 361/391, 399, 361/412, 413, 415; 403/16, 321, 322; 439/152, 153, 155, 157, 159, 160, 180, 59–62, 325, 327–329

[56] References Cited

U.S. PATENT DOCUMENTS

| | | |
|---|---|---|
| 3,798,507 | 3/1974 | Damon et al. |
| 3,952,232 | 4/1976 | Coules |
| 4,064,551 | 12/1977 | Lightfoot |
| 4,233,646 | 11/1980 | Leung et al. |
| 4,313,150 | 1/1982 | Chu |
| 4,445,740 | 5/1984 | Wallace |
| 4,564,250 | 1/1986 | Klein et al. ............ 439/152 |
| 4,596,907 | 6/1986 | LaGreco et al. |
| 4,606,591 | 8/1986 | Bloch |
| 4,632,588 | 12/1986 | Fitzpatrick |
| 4,648,009 | 3/1987 | Beun et al. |

OTHER PUBLICATIONS

"Central Control and Switching: SL-1 Common Equipment" by Alan Chapman and Jack Reid, Telesis, Fall 1975, pp. 78 and 79.

*Primary Examiner*—Gregory D. Thompson
*Attorney, Agent, or Firm*—John E. Mowle

[57] ABSTRACT

A latching mechanism for use with a plug-in cartridge or the like. The latching mechanism comprises a body portion; a pair of walls extending from the body portion; a camming portion; and an actuating portion. The walls of the latching mechanism are snap locatable onto pivot pins on a face plate of the plug-in cartridge, or the like, and thereby allow the latching mechanism to pivot on the face plate. Furthermore, the walls of the latching mechanism have apertures which are snap locatable onto detents on the face plate thereby resiliently latching the latching mechanism when it is fully inserted into a cabinet. The camming portion projects from the latching mechanism and is used for engaging a cooperating projection on a cover of the cabinet. The camming portion and the actuating portion cooperate to function as a lever, the camming portion being engageable with an inside surface of a mating apparatus to establish a first engagaement about which the latching mechanism is levered to overcome an insertion force, and engageable with an outside surface of the mating apparatus to establish a second engagement about which the latching mechanism is levered to overcome an extraction force. When the latching mechanism is in a latched position the latching mechanism is flush with the face plate. To disengage the latching mechanism from the detents, the actuating portion must be levered out from the face plate by a blade, or the like.

4 Claims, 4 Drawing Sheets

LATCH MECHANISM FOR A PLUG-IN CARTRIDGE OR THE LIKE

FIELD OF THE INVENTION

The present invention relates generally to latching mechanisms. In particular, the present invention relates to latching mechanisms for aiding the insertion into, the removal from, and the retention in, of objects relative to a mating piece of apparatus.

BACKGROUND OF THE INVENTION

Printed circuit boards (PCBs) are generally mounted in frames, with a large number of PCBs mounted in each frame, with as high a density as possible, in order to save space. A typical PCB comprises a pattern of electrical interconnections on a flat rectangular sheet of insulating material carrying a number of components. The four edges of the PCB can be referred to as a front edge, a back (or rear) edge, a top edge, and a bottom edge. The PCB slides into guide channels in the frame, the PCBs lying normally in a vertical plane with the top edge in a top guide channel, the bottom edge in a bottom guide channel, and the rear edge carrying a set of connections which mate with a corresponding set of connections mounted to the frame. The front edge of the PCB may carry two devices (one usually near the top, and one usually near the bottom) to aid in inserting, removing or retaining the PCB relative to the frame.

Various prior art devices for performing this function are depicted in the following U.S. patents and attention is directed to them: U.S. Pat. No. 4,648,009 dated Mar. 3, 1987 to R. A. Beun et al.; U.S. Pat. No. 4,632,588 dated Dec. 30, 1986 to M. H. Fitzpatrick; U.S. Pat. No. 4,606,591 dated Aug. 19, 1986 to K. A. Bloch; U.S. Pat. No. 4,596,907 dated June 24, 1986 to A. S. LaGreco et al.; U.S. Pat. No. 4,445,740 dated May 1, 1984 to K. L. Wallace; U.S. Pat. No. 4,313,150 dated Jan. 26, 1982 to Pak-Jong Chu; U.S. Pat. No. 4,233,646 dated Nov. 11, 1980 to E. C. Leung et al.; U.S. Pat. No. 4,064,551 dated Dec. 20, 1977 to R. Lightfoot; U.S. Pat. No. 3,952,232 dated Apr. 20, 1976 to R. A. Coules; and U.S. Pat. No. 3,798,507 dated Mar. 19, 1974 to N. F. Damon et al. Another prior art device is pictured on pages 78 and 79 of the Fall 1975 issue of Telesis published by Bell-Northern Research Ltd., Ottawa, Ontario, Canada.

The Leung patent discloses a latching lever having a latching mechanism which comprises a hooked portion flexibly connected to the body portion of the latching lever, an actuating member solidly connected to the hooked portion for moving the hooked portion relative to the body portion, and a stop portion, solidly connected to the body portion for limiting the movement of the actuating member. A stud carried by the PCB is engaged by the hooked portion of the lever to enable the lever to latch. Moving the actuating member disengages the hooked portion from the stud, thereby unlatching the lever, and leaving the lever free to pivot about its pivot point.

Prior art devices of the type described above have the disadvantage of having weak areas, such as where the actuating member and the hooked portion are attached, which may not withstand the stresses incurred from repetitive insertion and removal of a PCB. Over time the web joining the actuating member, or the hooked portion, to the lever may wear out allowing either, or both, to break off. Without these items the device will not function as intended.

Other prior art devices, such as described in the Chu patent, have the disadvantage that the lever must be attached by means of a rivet or screw and nut assembly. This can add to the cost and time of manufacturing and assembling the lever.

SUMMARY OF THE INVENTION

The present invention is a latching mechanism which is of simple one piece rigid construction. Assembly of the latching mechanism to a cover plate is easily accomplished by snap fitting the latch assembly over a pair of pivot pins. Additionally, the latching mechanism of the present invention provides a simple yet effective means of locking the latching mechanism in a latched position by providing a pair detents which forcibly interact with a pair of channels thereby further providing a tactile and audible feedback. Furthermore, the flush appearance of the latch assembly provides a minimum gap and protrusion making the latch assembly tool-removable to comply with national safety standards. Moreover, the present invention aids the insertion into, the removal from, and the retention in, of a plug-in cartridge or the like relative to a cabinet while maintaining a flush appearance with a face plate of the plug-in cartridge or the like.

Stated in other terms, the present invention is a latching mechanism for use with an object for aiding the entry of the object into a mating apparatus, for securing the object in the mating apparatus, and for aiding the removal of the object from the mating apparatus, the latching mechanism comprising: a body portion; a pair of walls extending from the body portion, the walls having means for rotatably mounting, about a pivot point, the object therebetween, facing portions of the walls having facing channels snap locatable onto detents on opposite faces of the object to resiliently latch the latching mechanism when the object is fully inserted into the mating apparatus; a camming portion, mounted to the body portion, and projecting therefrom at an end of the body portion nearest the pivot point, for engaging a projection on the mating apparatus; and, an actuating portion remote from the pivot point, for selectively disengaging the latching mechanism from the mating apparatus and for providing leverage for the camming portion; the camming portion and the actuating portion cooperating to function as a lever, the camming portion engageable with an inside surface of the projection to establish a first engagement about which the latching mechanism is levered to overcome an insertion force, and engageable with an outside surface of the mating apparatus to establish a second engagement about which the latching mechanism is levered to overcome an extraction force.

Stated in yet other terms, the present invention is the combination of a printed circuit board (PCB), a face plate, and a latching mechanism for use in aiding the entry of the PCB into a mating apparatus, for securing the PCB in the mating apparatus, and for aiding the removal of the PCB from the mating apparatus, the combination characterized by: the latching mechanism comprising: a body portion; a pair of walls extending from the body portion, the walls having means for rotatably mounting, about a pivot point, the object therebetween, facing portions of the walls having facing channels snap locatable onto detents on opposite faces of the object to resiliently latch the latching mechanism when the object is fully inserted into the mating apparatus; a camming portion, mounted to the body portion, and projecting therefrom at an end of the body portion nearest the pivot point, for engaging a projection on the mating apparatus; and, an actuating portion remote from the pivot point, for selectively disengaging the latching mechanism from the mating apparatus and for providing leverage for the camming portion; the camming portion and the actuating portion cooperating to function as a lever, the camming portion engageable with an inside surface of the projection to establish a first engagement about which the latching mechanism is levered to overcome an insertion force, and engageable with an outside surface of the mating apparatus to establish a second engagement about which the latching mechanism is levered to overcome an extraction force.

BRIEF DESCRIPTION OF THE DRAWINGS

The invention will be readily understood by the following description of a preferred embodiment, by way of example, in conjunction with the accompanying diagrammatic drawings, in which.

DETAILED DESCRIPTION OF THE INVENTION

Figure 1:
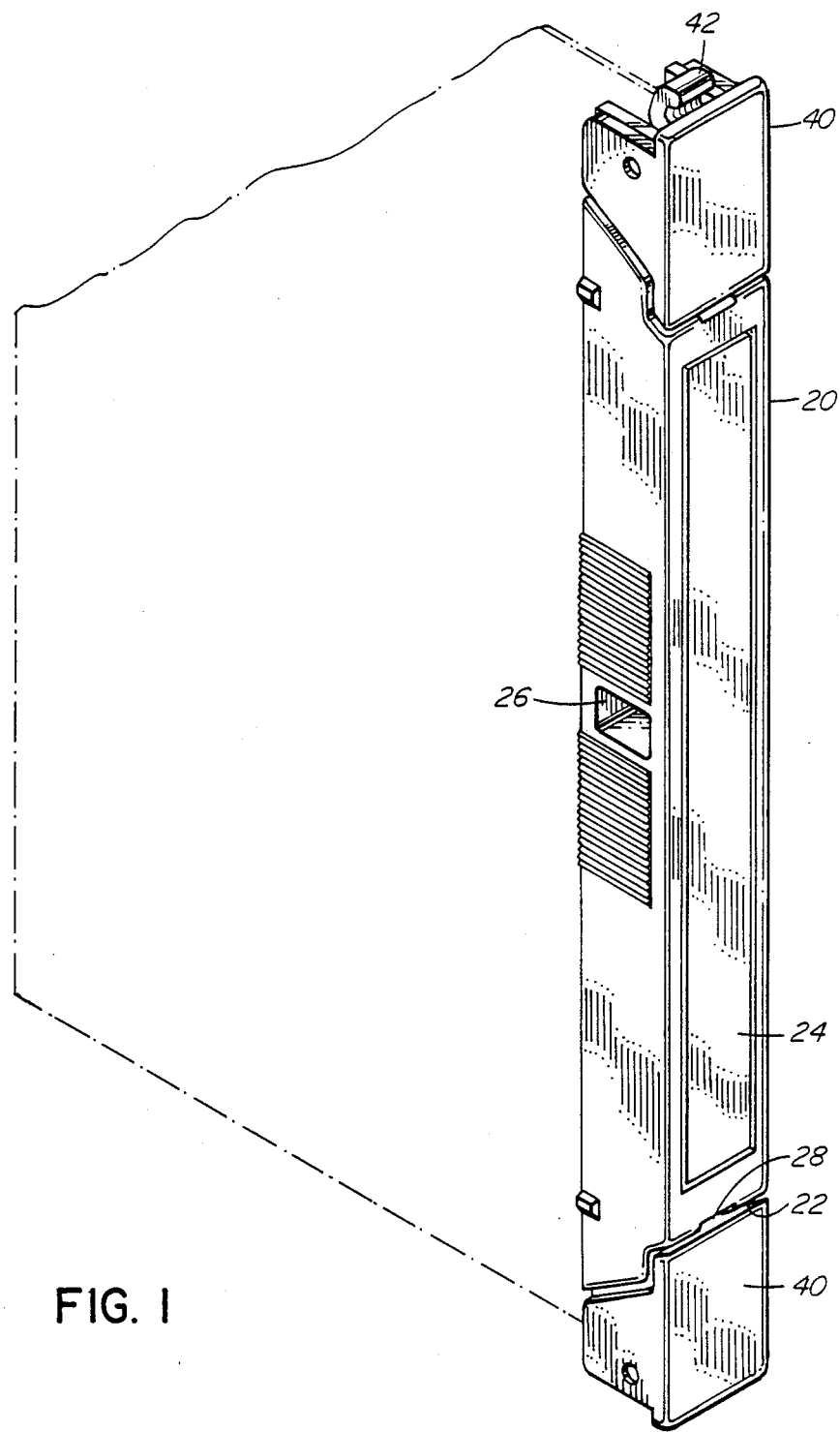
FIG. 1 is a perspective view of a plug-in cartridge utilizing the latching mechanism of the present invention.

Referring to the Figures, there is illustrated a plug-in cartridge 10 consisting of a printed circuit board 12 having a face plate 20 affixed thereto. The face plate 20 is affixed to the printed circuit board 12 by a suitable fastener placed through openings 26 (one of which is illustrated in FIG. 1). Pivotally affixed to the face plate 20 are a pair of latching mechanisms 40, one at each end. The latching mechanisms 40 are designed to reside in recesses 22 within the face plate 20 so as to be flush with the front face 24 of the face plate 20 when the latching mechanisms 40 are in a latched position. FIG. 1 further illustrates a pair of slots 28 formed in the face plate 20 which are provided to allow an object, such as a blade or a screwdriver, to be slipped under the latching mechanisms 40 when in their latched positions (as shown in FIG. 1) to thereby pry the latching mechanisms 40 open. Further depicted in FIG. 1 is a camming member 42 integrally formed with the latching mechanism 40. Camming member 42 is provided to aid the insertion into, the removal from, and the retention in, of the plug-in cartridge 10 relative to a mating frame or cabinet 60 (shown in FIGS. 5-7).

Figure 2:
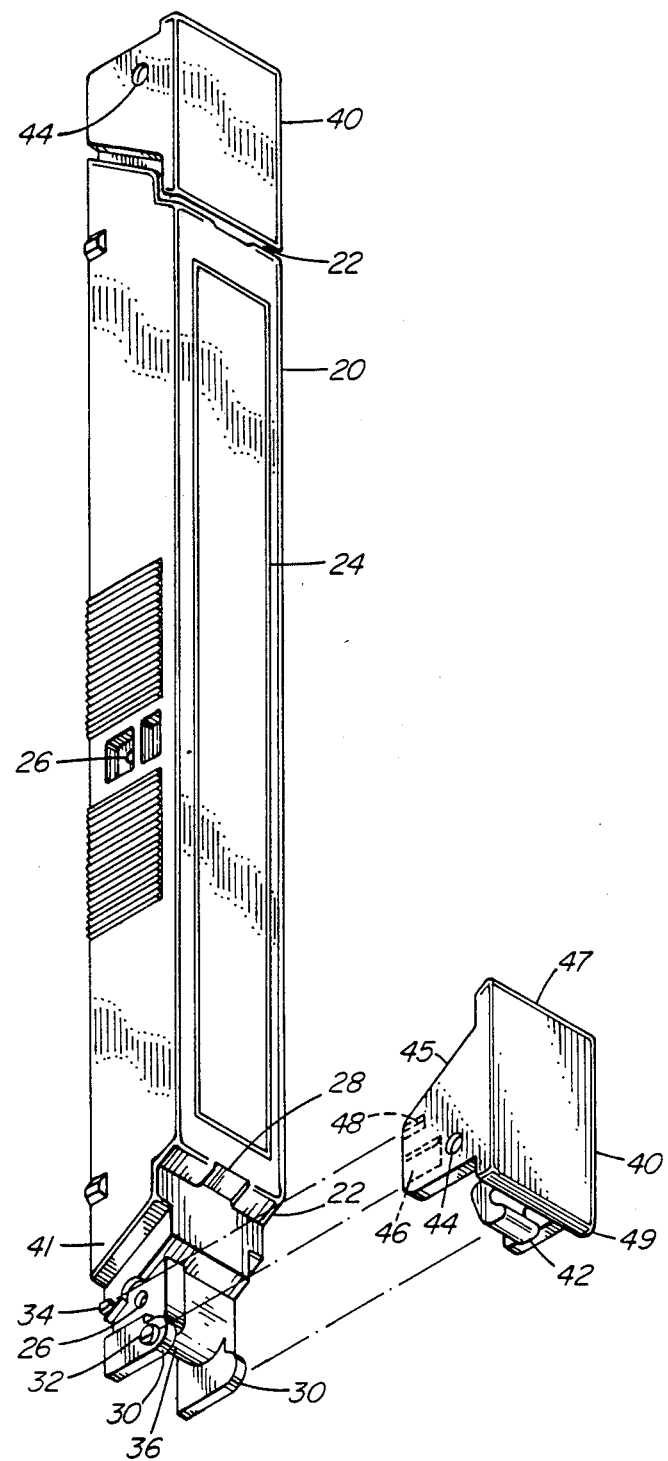
FIG. 2 is an exploded view of a face plate having attached thereto the latching mechanism of the present invention.
Figure 3:
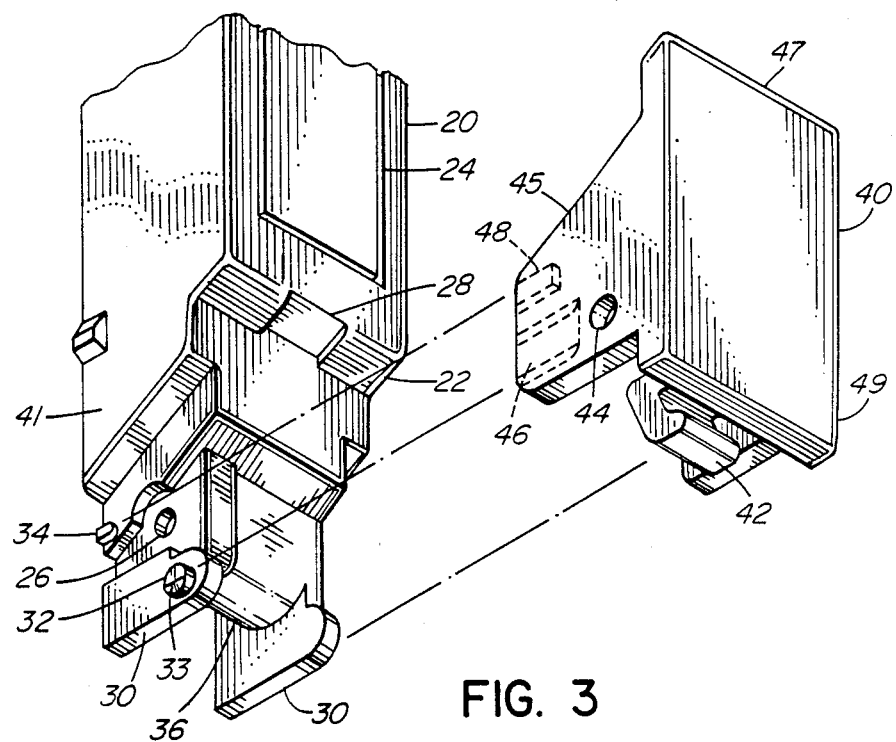
FIG. 3 is an enlarged view of the partial exploded view of FIG. 2.
Figure 4:
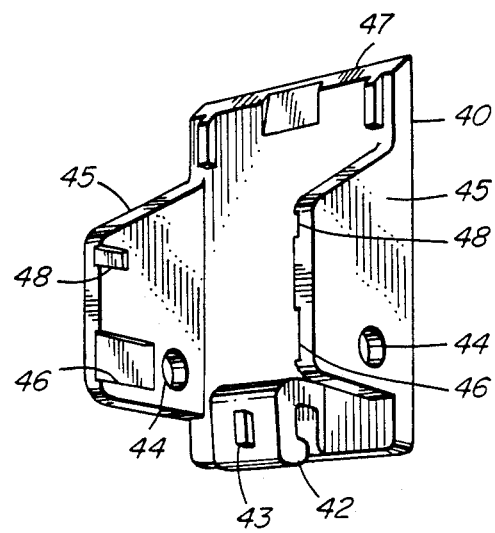
FIG. 4 is a perspective view of the latching mechanism.
Figure 5:
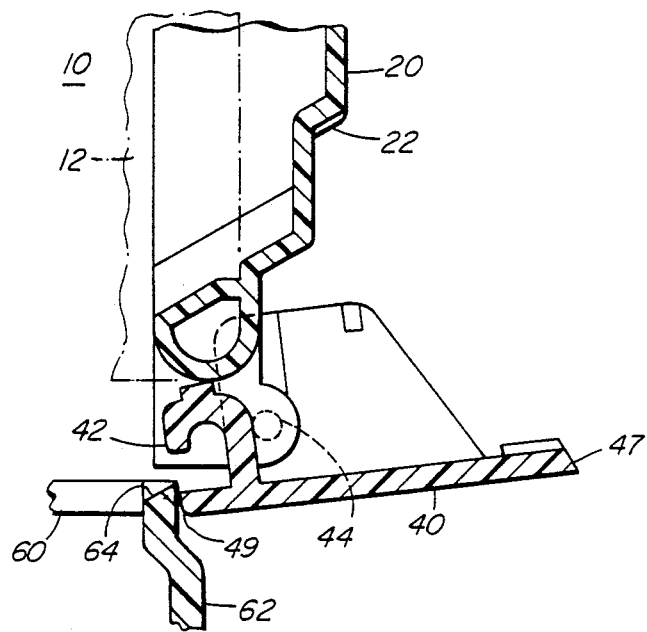
FIG. 5 is a cross-sectional view of the latching mechanism of the present invention in a fully open position.

FIGS. 2 and 3 illustrate the face plate 20 with one of the latching mechanisms 40 removed In these Figures a pair of pivot supports 30 are shown extending from the end 41 of the face plate 20. Affixed to each of the pivot supports 30 is a pivot pin 32 (only one of which is visible in the Figures). Each of the pivot pins 32 is bevelled along a portion 33 to facilitate attachment of the latching mechanism 40. During assembly the latching mechanism 40 is held in an open position (such as shown in FIG. 5) and snap fitted over the pivot pins 32. The assembly is aided by the provision of the bevels 33 and by a pair of channelled ramps 46 on each wall 45 (as shown in FIG. 4) of the latching mechanism 40. The channelled ramps 46 help direct the pivot pins 32 into the pivot openings 44 and help spread the resiliently flexible walls 45 allowing them to slip over the pivot pins 32.

Figure 7:
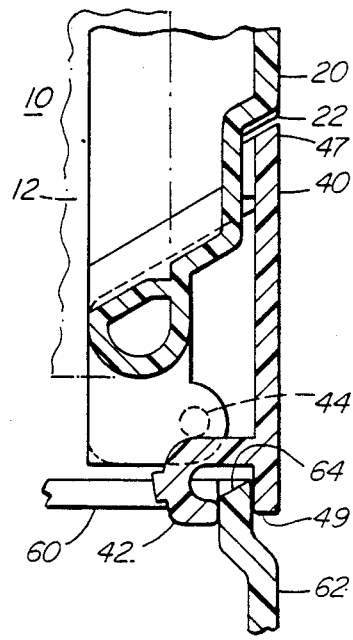
FIG. 7 is a cross-sectional view of the latching mechanism of FIG. 4, but showing the latching mechanism in a latched position.

Further illustrated in FIGS. 2 and 3 is one of a pair of detents 34. Each of the detents 34 are positioned so as to forcibly engage with one of a pair of channels 48 formed in each of the walls 45 (as shown in FIG. 4). The detents 34 provide a means of locking the latching mechanism 40 in a latched position (as shown in FIG. 7). Furthermore, the action of the detents 34 against the walls of the channels 48 provide a tactile and audible feedback.

Figure 6:
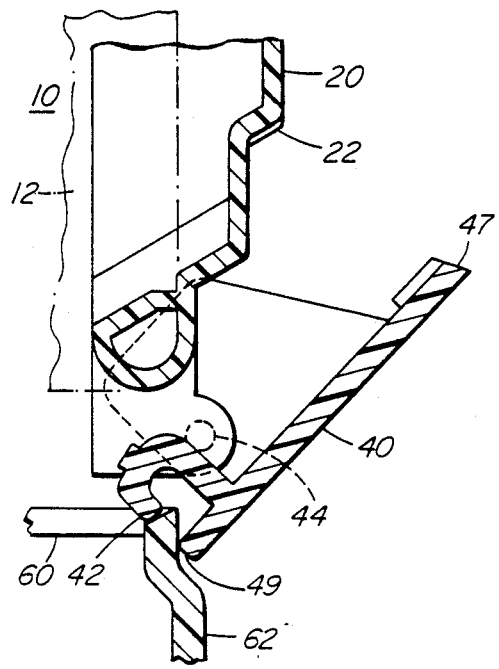
FIG. 6 is a cross-sectional view of the latching mechanism of FIG. 4, but showing the latching mechanism in an intermediate position.

FIGS. 5 to 7 illustrate the latching mechanism 40 in operation. With the latching mechanism 40 in an open position, as illustrated in FIG. 5, the plug-in cartridge 10 is inserted into a cabinet 60 and pushed in as far as possible so as to engage connectors (not shown) on the printed circuit board 12 with connectors in the cabinet 60. Due to the shape of the latching mechanism 40 the latching mechanism 40 will automatically engage a cabinet cover 62 and rotate toward a closed position, as illustrated in FIG. 6. As the latching mechanism 40 is rotated toward the face plate 20, the camming member 42 engages a projection 64 on the cabinet cover 62. Further rotation of the latching mechanism 40 by pressing on the actuating portion 47 causes the camming member 42 to act against the cabinet cover 62. The latching mechanism 40 can therefore be used to overcome the insertion stress of the plug-in cartridge 10, thereby forcing the plug-in cartridge 10 into the cabinet 60. The operator then rotates each latching mechanism 40 to a latched position, as illustrated in FIG. 7, which will push the plug-in cartridge 10 fully into the cabinet 60 thereby fully engaging the connectors. When each latching mechanism 40 approaches the latched position, the walls 45 of the latching mechanism 40 ride over the detents 34 until the detents 34 align with the channels 48 allowing the walls 45 to snap back to their original orientation In doing so, the detents 34 provide a tactile feed back and a click is heard. The detents 34 and the channels 48 cooperate to maintain the latching mechanism 40 in a latched position.

To remove the plug-in cartridge 10 a blade or screw driver is inserted in the slot 28 to provide sufficient leverage on actuating portion 47 to free the walls 45 from the detents 34. Latching mechanism 40 can then be opened by hand. In doing so a lip 49 on latching mechanism 40 pushes against the cabinet cover 62 thus providing a means for counteracting the removal stress of the plug-in cartridge 10, thereby pulling the plug-in cartridge 10 from the connectors and the cabinet 60.

In a preferred embodiment, a stop member 43 (visible in FIGS. 3 and 4) is integrally formed with the latching mechanism 40. The stop member 43 interacts with stop portion 36 on the face plate 20 to prevent the latching mechanism 40 from being over rotated during opening.

This helps maintain the latching mechanism 40 in a practical position for reinsertion into the cabinet 60.

It can be readily realized that if the latching mechanism 40 is in a closed position, i.e. maintained against the face plate 20 by the detents 34; when the plug-in cartridge 10 is not inserted in the cabinet 60, the camming member 42 will prevent the insertion of the plug-in cartridge 10 into the cabinet 60. This can be a useful feature where it is desired to disconnect a plug-in cartridge 10 from a connector but still keep the plug-in cartridge 10 supported in the cabinet 60 while preventing accidental insertion.

Numerous modifications, variations, and adaptations may be made to the particular embodiments of the invention described above without departing from the scope of the claims.

What is claimed is:

1. The combination of a printed circuit board (PCB), a face plate attached to one end of said PCB and a latching mechanism for use in aiding the insertion of said PCB into a mating apparatus, for securing said PCB in said mating apparatus, and for aiding the extraction of said PCB from said mating apparatus, said combination characterized by:

said latching mechanism comprising: a body portion; a pair of walls extending from said body portion, facing portions of said walls having means for rotatably mounting said latching mechanism on opposite faces of said face plate, the facing portions of said walls also having facing channels snap locatable onto detents on said opposite faces of said face plate to resiliently latch said latching mechanism when said PCB is fully inserted into said mating apparatus; a camming portion projecting form an end of said body portion, said camming portion adapted to engage a projection on said mating apparatus; and an actuating portion providing leverage for said camming portion; said camming portion and said actuating portion cooperating to function as a lever, said camming portion adapted to engage an inside surface of said projection to establish a first engagement about which said latching mechanism is levered to overcome an insertion force, and adapted to engage an outside surface of said projection to establish a second engagement about which said latching mechanism is levered to overcome an extraction force.

2. The combination as claimed in claim 1 wherein said means for rotatably mounting said latching mechanism is a pair of apertures, one aperture in each wall of said pair of walls, each aperture of said pair of apertures adapted to permit insertion of one pin of a pair of pins on said opposite faces of said face plate, said walls being resiliently flexible to allow said latching mechanism to be assembled over said pins until said pins snap into a respective aperture.

3. The combination as claimed in claim 1 or 2 wherein said latching mechanism assumes a flush position against said face plate when said PCB is inserted in said mating apparatus and said latching mechanism is in a latched position.

4. The combination as claimed in claim 1 or 2 further comprising an additional latching mechanism identical to said latching mechanism said latching mechanism and said additional latching mechanism are located at opposite ends of said face plate and oriented such that said actuating portion of said latching mechanism faces said actuating portion of said additional latching mechanism to thereby allow latching to said mating apparatus at opposite ends of said face plate.

* * * * *